United States Patent [19]

Ferri et al.

[11] Patent Number: 5,519,299
[45] Date of Patent: May 21, 1996

[54] METHOD AND APPARATUS FOR DETERMINING AND ENCODING THE POSITION OF A REVERSER HANDLE ON A LOCOMOTIVE CONTROL STAND

[75] Inventors: Vincent Ferri, Pittsburgh; Ralph Santoro, Jr., New Kensington; Paul J. Kettle, Jr.; Craig A. Miller, both of Pittsburgh, all of Pa.

[73] Assignee: Westinghouse Air Brake Company, Wilmerding, Pa.

[21] Appl. No.: 340,651

[22] Filed: Nov. 16, 1994

[51] Int. Cl.⁶ .......................... H03M 1/24; F16H 61/00
[52] U.S. Cl. .......................... 318/640; 318/632; 477/78; 200/6 A; 250/231.1
[58] Field of Search ...................... 318/560–646; 340/870.31; 74/471 XY; 345/166; 250/231.15, 231.13, 229, 202, 231.16, 221, 233; 364/167.01, 190, 424.1; 341/31, 5, 161; 200/6 A, 11 TW, 61.45 R; 477/75, 78

[56] References Cited

U.S. PATENT DOCUMENTS

| | | |
|---|---|---|
| 3,598,933 | 8/1971 | Walser ........................... 200/11 |
| 3,715,579 | 2/1973 | Eblovi . |
| 3,794,834 | 2/1974 | Auer et al. . |
| 3,805,056 | 4/1974 | Birkin . |
| 3,989,943 | 11/1976 | Campbell ..................... 250/233 |
| 4,338,832 | 7/1982 | Pelligrino ..................... 74/866 |
| 4,523,224 | 6/1985 | Longacre, Jr. ................. 358/42 |
| 4,727,356 | 2/1988 | Abe et al. ..................... 250/231 SE |
| 4,737,905 | 4/1988 | Yoshida et al. ............... 364/190 |
| 4,795,902 | 1/1989 | Kitaue ........................... 250/231 SE |
| 4,831,359 | 5/1989 | Newell .......................... 341/5 |
| 4,968,896 | 11/1990 | Shibata et al. ................ 308/10.8 |
| 5,016,840 | 5/1991 | Bezos . |
| 5,085,125 | 2/1992 | Emo et al. .................... 91/459 |
| 5,107,080 | 4/1992 | Rosen ........................... 200/6 A |
| 5,252,821 | 10/1993 | Sugimura ..................... 250/22 |
| 5,352,889 | 10/1994 | Fujieda et al. ................ 250/229 |
| 5,385,515 | 1/1995 | Chan et al. .................... 477/75 |
| 5,392,146 | 2/1995 | Jackson et al. ............... 359/145 |
| 5,406,076 | 4/1995 | Mimura et al. ............... 250/229 |
| 5,415,604 | 5/1995 | Bates et al. ................... 477/78 |
| 5,416,700 | 5/1995 | Bates et al. ................... 364/424.1 |

Primary Examiner—Paul Ip
Attorney, Agent, or Firm—James Ray & Associates

[57] ABSTRACT

Apparatus for determining and encoding the position of a reverser control handle on a control stand of a locomotive or other railway transit vehicle of the type having a reverser control handle attached to an axle partially rotatable through a defined angle and including a pair of stationary signal transmitting sensor means, and a pair of sensor activators secured to the axle adapted for partial rotation with the axle, whereby one each of the pair of sensor activators are positioned proximate to one each of the signal transmitting sensor means, so that any partial rotation of the axle in one given will be sensed by one such signal transmitting sensor means to provide a second signal, and partial rotation of the axle in the opposite direction will be sensed by the other signal transmitting sensor means to provide a second signal.

16 Claims, 2 Drawing Sheets

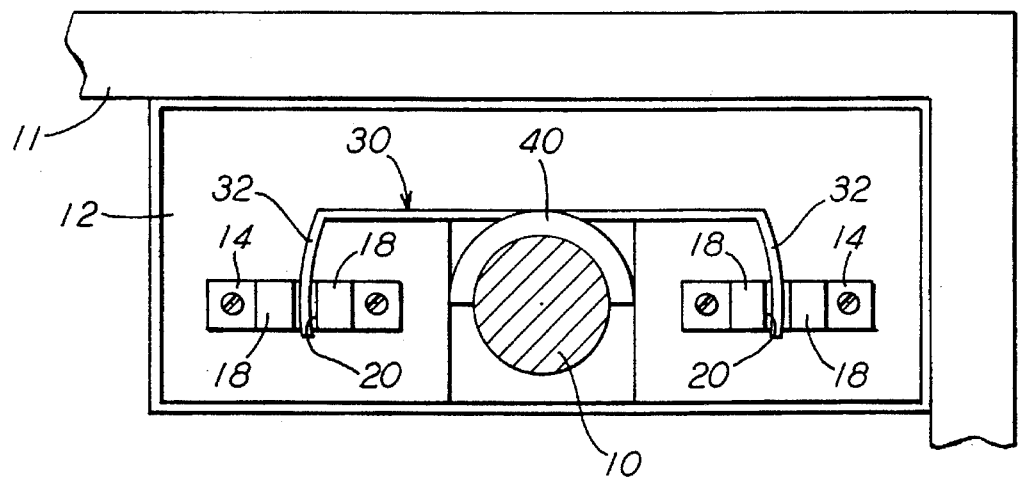
FIG. 1
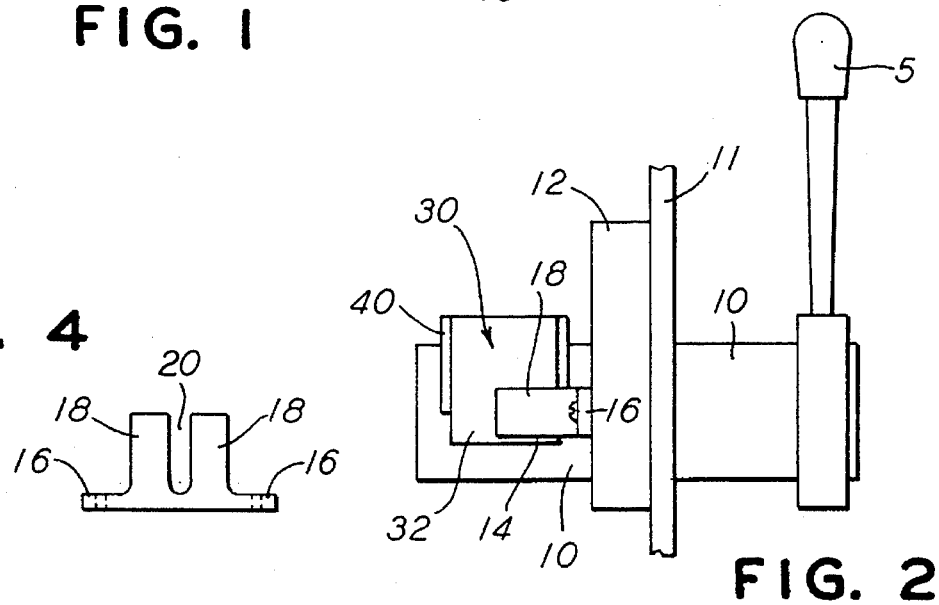
FIG. 4
FIG. 2
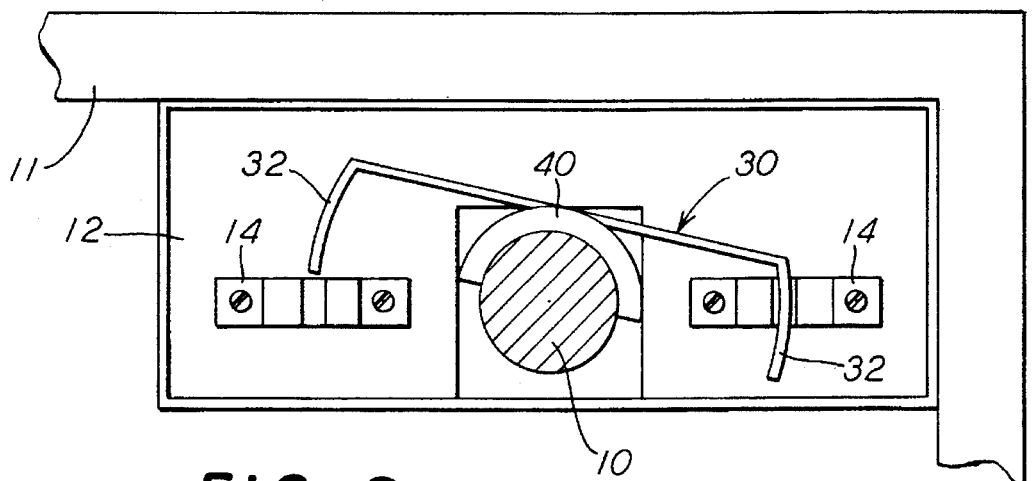
FIG. 3

5,519,299

METHOD AND APPARATUS FOR DETERMINING AND ENCODING THE POSITION OF A REVERSER HANDLE ON A LOCOMOTIVE CONTROL STAND

FIELD OF THE INVENTION

The present invention relates generally to a control stand for a locomotive or other railway transit vehicle, and more particularly to a method and apparatus for determining the position of the reverser control handle on a locomotive control stand and encoding such position for transmission to a microcomputer which will effect any such control change at the locomotive drive motors.

CROSS REFERENCE TO RELATED APPLICATIONS

The invention taught in this patent application is closely related to the inventions taught in the following co-pending patent applications: Electronically Controlled Locomotive Throttle Controller Including Remote Multiple Unit Throttle Control; Digital Output Control Device and Method For Operating; Method And Apparatus For Feedback Of Trainline Status To The Central Processor Of A Locomotive Throttle Controller; Apparatus For Interlocking Throttle, Dynamic Brake And Reverser Handles On A Control Stand Of A Railway Locomotive; Method Of Performing Diagnostics On An Electronically Controlled Railway Locomotive Throttle Controller; Method Of Operating A Locomotive Mounted Throttle Controller Between Two Modes Of Operation Including A Transition Between Such Two Modes; An Apparatus For And A Method Of Generating An Analog Signal For Control Of Dynamic Braking; An Apparatus For Feedback Of An Analog Signal Used To Monitor And/Or Control Dynamic Braking And Method Of Operating; An Apparatus To Enable Controlling A Throttle Controller From A Remote Host; Apparatus For Interlocking Reverser Handle On A Control Stand Of A Railway Locomotive; and, Apparatus For Determining The Absolute Position Of Throttle, Dynamic Brake And Reverser Handles On A Locomotive Control Stand. Each of the above-referenced patent applications are being filed concurrently herewith and are assigned to the assignee of this invention. Additionally, the teachings of each of these patent applications is incorporated herein by reference thereto.

BACKGROUND OF THE INVENTION

In railroad locomotive operations, the throttle, dynamic brake and reverser actions of the locomotive, locomotives or other drive units, are controlled by the operator or engineer in the cab of the lead unit by manipulating three handles extending from the control stand, one handle each for throttle, dynamic brake, and reverser. The throttle handle, of course, controls the development of the tractive effort of the locomotive; i.e., the diesel engines or other power units. The dynamic brake handle controls the development of a retarding force known a dynamic brake, for example the electric motors driving the locomotive wheels, to place them in either motor mode where they will drive the wheels, or in generator mode, where they will function as a retarding force. The reverser handle controls the forward and reverse rotation of the electric motors to selectively drive the train forward or rearward, and includes a neutral position. Pursuant to current practice, the control stand is designed to be a man-to-machine interface and ideally is strictly an electronic/electric device having no direct mechanical, hydraulic or pneumatic connections the devices controlled. Instead, encoding means are preferably provided within the control stand to read and interpret the positions of the three handles, and convey appropriate signals, indicative of such positions, to an associated microcomputer. The associated microcomputer is programmed to interpret the encoded signals regarding the positions of the throttle, dynamic brake and reverser handles, as positioned at the control stand, and then electronically issue corresponding commands to manipulate the devices intended within the locomotive or locomotives. When utilizing a microcomputer, the throttle, dynamic brake and reverser commands effected at the control stand, are dependent upon the given angular positions of the three control handles, which are normally sensed and monitored by rotary encoding devices, which are mechanically coupled to associated rotary axles to which the control handles are secured, utilizing cams to actuate microswitches or contacts to provide a signal to the microcomputer as noted above. Such mechanical devices leave a lot to be desired, in that they do not provide the exacting degree of handle position determination as desired, are prone to mechanical failure, are cumbersome, space consuming, and require frequent adjustment.

There has been considerable development effort in the recent past to improve the encoder technology, particularly with regard to obtaining a more absolute determination and reading of the control handle positions. With regard to the throttle and dynamic brake controls in particular, there is need for more accurate and absolute encoder determinations because these controls can be set over a rather wide range of setting. The reverser control, on the other hand, is positionable to only three positions, namely, a "neutral" position at the center, and "forward" and "reverse" positions at either end. Accordingly, with regard to the reverser control, there is no need for any costly and complicated encoder technique to determine an absolute and exacting control handle position or command, as all that is necessary to determine in which of the three positions the handle is located, namely, "forward", "reverse" or "neutral". Accordingly, while the prior art mechanically linked encoders leave much to be desired, the newer absolute position encoders are more costly and complicated than is necessary for the simple task of encoding the three positions of the reverser control handle.

SUMMARY OF THE INVENTION

The present invention is predicated upon a new and improved method and apparatus of determining and encoding the position of the reverser control handle on a locomotive control stand which is exceptionally simple, low cost, reliable, and easy to install in a restricted space.

In essence, the new and improved encoding method and apparatus of this invention involves the use of a pair of stationary sensing means, such as a position sensing means, positioned on a structural element adjacent the partially rotatable reverser axle, that is, the axle rotatable by the reverser control handle. A pair of sensor activators are rigidly secured to the axle, and positioned such that at an intermediate rotational position of the axle, representing the "neutral" position of the handle, one each of the sensor activators is positioned adjacent to one each of the sensing means in an identical relationship, so that the pair of sensing means will each provide a given signal, which may or may not be identical. Then, a partial rotation of the reverser axle in a in either direction, will cause a first of the sensor activators to be displaced from that sensing means adjacent thereto, thereby causing that adjacent sensing means to transmit a second signal different from its first signal. An identical result is obtained when the axle is partially rotated in the opposite direction, but causing the other sensing means to transmit a different second signal. Specifically, a partial rotation of the axle in the other direction will cause the second of the sensor activator to be displaced from the other of the sensing means adjacent thereto, thereby causing such other, adjacent sensing means to provide a second signal different from its first signal. Accordingly, three different combined pairs of signals will be transmitted to be easily deciphered by the microprocessor. Specifically, when the reverser control handle is in the "neutral" position, the two first signals, which may or may not be identical, will be transmitted, indicating that the reverser control handle is in the "neutral" position. When one of the two first signal changes to the second signal, the encoder is indicating that reverser handle has been moved and is in either the "forward" or "reverse" position, which of the two depending upon which of the two signals has been changed. For example, a change in the first signal could indicate the reverser control handle is in "forward" position, so that a change in the second signal would naturally indicate the reverser handle is in the "reverse" position. Obviously, the microcomputer will have to be programmed to distinguish between the two so as to properly command the motor controller into a forward or reverse setting.

OBJECTS OF THE INVENTION

It is, therefore, one of the primary objects of the present invention to provide a new and improved method and apparatus for determining and encoding the position of a reverser control handle on a locomotive control stand.

It is another primary objects of the present invention to provide a new and improved method and apparatus for determining and encoding the position of a reverser control handle on a locomotive control stand which is simple, reliable, inexpensive, and easy to install.

A further object of this invention is to provide a new and improved, low cost method and apparatus for determining and encoding the position of a reverser control handle on a locomotive control stand which does not rely conventional encoders which must be mechanically coupled to the reverser control handle.

An even further object of this invention is to provide a new and improved, low cost method and apparatus for determining and encoding the position of a reverser control handle on a locomotive control stand which does not utilize expensive and complicated absolute position encoders.

These and other objects and advantages will be realized from a full understanding of the following detailed description particularly when read in conjunction with the attached drawings, as described below.

BRIEF DESCRIPTION OF THE DRAWINGS

FIG. 1 is a plan view of the apparatus of this invention showing the apparatus in relation to a section through the reverser control axle, and illustrating the relative positioning of the apparatus when the reverser control handle in the "neutral" position.

FIG. 2 is a side view of the apparatus as shown and positioned in FIG. 1.

FIG. 3 is identical to FIG. 1 except that it illustrates the relative positioning of the apparatus when the reverser control handle has been moved to either one of the "forward" or "reverse" positions.

FIG. 4 is an enlarged side view of a slotted optical switch as utilized as a position sensing means as illustrated in FIGS. 1 and 2.

DESCRIPTION OF A PREFERRED EMBODIMENT OF THE INVENTION

Figure 5:
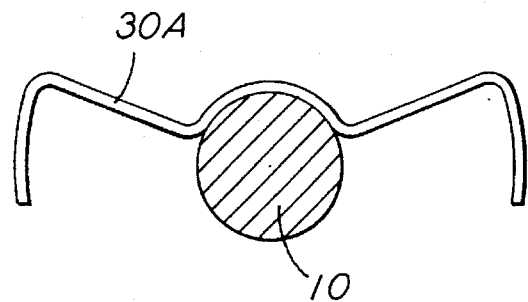
FIG. 5 is an end view of another embodiment of the vane, different from that shown in FIGS. 1 and 2, as may be necessary for use with reverser axles having a greater arcuate displacement than that shown in FIGS. 1 and 2, or for use without including a spacer mounting block.

Prior to proceeding with a more detailed description of the encoder of this invention, it should be noted that throughout the several views illustrated in the attached drawings, identical components which have associated therewith identical functions have been identified with identical reference numerals for the sake of clarity.

Referring now to the several drawings, and particularly FIG. 1, illustrated therein is an end view the inventive apparatus of a presently preferred embodiment of this invention wherein a control handle 5 to be selectively positioned in either of a "forward", "reverse" or "neutral" position is rigidly attached to an axle 10. When the control handle 5 is moved from one position to another, axle 10 is caused to partially rotate through a defined arc. As shown in FIG. 1, axle 10 is seen as a cross-sectional view thereof, which extends perpendicularly through a stationary structural wall member 11. As depicted in FIG. 1, axle 10 is at an intermediate rotational position indicative of the control handle 5 being positioned in the "neutral" position.

A pair of sensing means such as position sensing means 14, are rigidly secured to a stationary structural member, such as mounting plate 12, secured to wall member 11, and placed adjacent to axle 10, preferably, diametrically positioned on either side of axle 10 and equally spaced therefrom. While it is believed that practically any sort of a position sensing means could be made to work, the preferred position sensing means 14, as utilized in the preferred embodiment of the invention, is a simple and low cost, slotted optical switch, such as those provided with a light emitting diode (LED) and non-amplified, phototransistor output, as produced by Omron Electronics Inc., of 1 East Commerce Drive, Schaumburg, Ill. 60173, part number EE-SG3-B. This position sensor 14, the top view of which is shown in FIG. 1, has a side view as shown in FIG. 4, and includes a base flange 16 with a pair of holes therethrough for mounting purposes. The top surface of the slotted optical switch is provided with a pair of post members 18, spaced apart by a slot 20. A simple LED (not shown) is positioned in one of the two post members 18, and directed towards the other of the post members 18, which houses a non-amplified phototransistor (not shown) adapted to sense the light emitted from the LED (not shown). Through a pair of leads (not shown) in the bottom, the slotted optical switch is designed to transmit a given small current at a given voltage when the LED is unblocked, and a different current and/or voltage when it is blocked. Accordingly, the position sensor is adapted determine and signal whether there is a light blocking object positioned in slot 20 between the two posts 18.

A vane 30, is secured to a side of axle 10, and adapted to be rotated therewith. A sensor activator 32, such as a thin opaque strip of metal, is disposed at each end of vane 30, and positioned so that one each of the sensor activators 32; i.e., metal strips, is positioned within slot 20 between the two pairs of posts 18, on slotted optical sensors 14, when axle 10 is at an intermediate rotational position indicative of the control handle 5 being positioned in the "neutral" position. As can be seen in FIG. 1, it is intended that in the preferred embodiment and in this rotational position, the two sensor activators 32 both be positioned to block the LED light so that both sensor means 14 will provide identical signals. For simplicity of fabrication, the vane 30 and sensor activators 32, are fabricated from a single piece of sheet metal, and bent to the configuration as shown in FIG. 1.

FIG. 3 illustrates the situation where the reverser handle 5 has been moved into either one of the "forward" or "reverse" positions, which causes axle 10 to rotate as depicted in the Figure. In the situation depicted in FIG. 3, the rotational movement has been approximately 15 degrees. As further shown in FIG. 3, such rotation causes one of the sensor activators 32 to be virtually lifted from slot 20 between the two associated posts 18, thereby no longer providing a light obstruction between the LED and LED sensor (not shown) mounted within posts 18. Accordingly, the signal from that sensing means 14; i.e., the slotted optical switch, will change as necessary to encode notice that the reverser handle 5 has been moved to the new position; i.e., either the "forward" or "reverse" position. In so far as the other sensing means 14 is concerned, it can be seen that while the associated signal activator 32 is also moved, it is moved in the opposite direction, and is of sufficient length that despite such motion, it will continue to be a light obstruction within slot 20 between the associated posts 18. According, the rotational motion depicted in FIG. 3 will cause a change in the signal output only in the slotted optical switch 14 depicted on the left.

As should be quite apparent, had the operator or engineer moved the reverser handle in the opposite direction, the reverse situation would have occurred, whereby the sensor activator 32 on the right would have been lifted from slot 20 on the slotted optical sensor 14 on the right, so that then that slotted optical switch 14 on the right would transmit a changed signal.

As further shown in the Figures, vane 30 is tangenty attached to the top side of axle 10, as depicted in the drawings, so that upon rotation of axle 10, one of the sensor activators 32 will be lifted away from the associated sensing means 14, without having the opposite sensing means 14 interfere with the rotational movement. Accordingly, full partial rotation in either direction must be adapted to lift one of the sensor activator 32 from its associated slot 20, while the other sensor activator 32 must be free to be more deeply inserted within its associated slot 20 to continue to block the LED light so that there is no change in the signal provided by that sensor means 14. To this end, a spacer member 40 may be necessary to space vane 30 sufficiently away from the axis of axle 10 to assure sufficient space is provided to make the desired movements without the risk of vane 30 contacting either of the sensing means 14. As an alternative, a differently configured vane 30A can be utilizes as illustrated in FIG. 5.

As can be further seen from the figures, the sensor activators 32, as thin strips of metal, are preferably provided with a curved configuration radially spaced from the axis of axle 10 to facilitate their rotational movement, into and out-of, slots 120 without danger of contacting either of posts 18.

Figure 6:
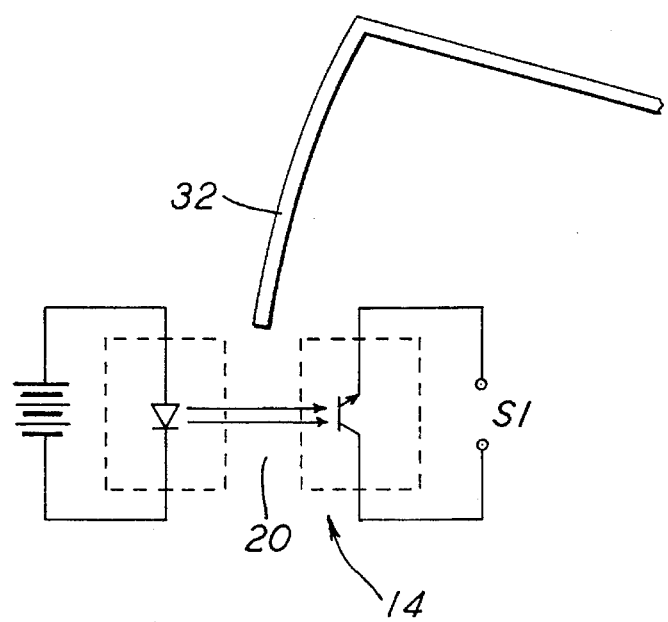
FIG. 6 is a schematic diagram of the signal generating circuit as it exists to generate the first signal, S1, in the apparatus of FIGS. 1–5.
Figure 7:
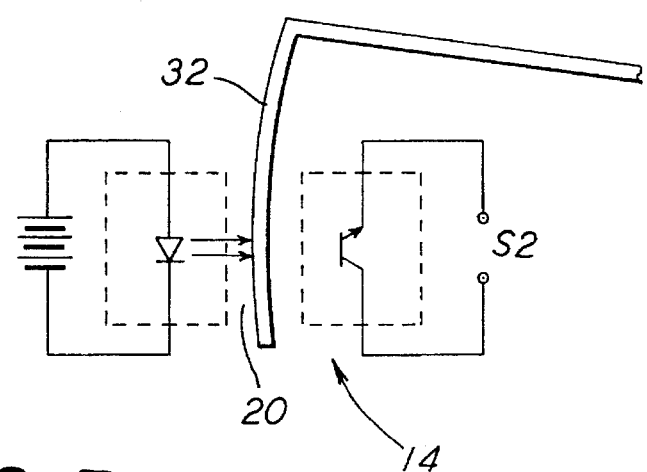
FIG. 7 is a schematic diagram of the signal generating circuit as if exists to generate the second signal, S2, in the apparatus of FIGS. 1–5.

With regard to the first and second signals themselves as produced by sensing means 14, the circuit conditions to effect such signals should be quite apparent and obvious to anyone skilled in the art. Nevertheless, circuit diagrams are shown in FIGS. 6 and 7, wherein the circuit diagram depicted in FIG. 6 is illustrative of the circuit in producing the first signal, S1, and the circuit diagram depicted in FIG. 7 is illustrative of the circuit in producing the second signal, S2.

As should be apparent from the above detailed description, a number of modification and other embodiments could be incorporated without departing from the spirit of the invention. For example, position sensing means 14 and sensor activators 32 could take any form adapted to send one signal when a signal activator is adjacent thereto, and another signal when the signal activator 32 is displaced from such close proximity. For example, magnetic, capacitance or variable resistance sensors could be utilizes if one wishes, or any one of a number of other sensing techniques. While the apparatus as shown has been designed to provide symmetry on the two sides of the axle 10, it should be further apparent that such symmetry is not if fact necessary, as long as the intended results are achieved. For example, because of space limitations and other confinements, a departure from symmetry may be necessary to properly mount the sensor means 14 sensors and sensor activators 32. It should be further apparent that the relationship of the signals transmitted by the position sensor means 14 as described above can be different, as long as the microprocessor is programmed to distinguish between two different sensor means 14 and the two different signals as transmitted from each of the two sensor means 14. While the detailed description above represents the preferred technique as utilized in the presently preferred embodiment and represents a rather simple technique to achieved the desired results, it should be apparent that a great number of changes could be incorporated without departing from the spirit of the invention.

I claim:

1. In a reverser control handle on a control stand of a locomotive or other railway transit vehicle, positionable to forward, reverse and neutral positions, an apparatus for determining in which of the positions the reverser control handle is located, said apparatus comprising:

an axle partially rotatable through a defined angle of approximately 15 degrees in response to movement of said reverser control handle, wherein said forward and reverse positions are at extremes ends of said defined angle and said neutral position is intermediate said extreme ends;

a pair of stationary sensing means, positioned adjacent said axle;

a pair of sensor activators secured to said axle adapted for partial rotation with said axle through said defined angle, said pair of sensor activators being positioned such that at said neutral position intermediate said extreme ends, one each of said sensor activators is disposed proximate to one each of said sensing means, so that each of said pair of sensing means will provide identical first signals, and such that a partial rotation of said axle to a first of said extreme ends will cause a first of said sensor activators to be displaced from a first of said sensing means proximate thereto, thereby causing said first proximate position sensing means to provide a second signal different from its said first signal without causing any change in said first signal from a second of said sensing means, and such that a partial rotation of said axle in an opposite direction to a second of said extreme ends will cause said first of said sensor activators to be returned proximate to said first sensing means to restore said first signal from said first sensing means, and cause said second of said sensor activators to be displaced from a second sensing means proximate thereto, thereby causing said second sensing means to provide a second signal different from its said first signal.

2. An encoding apparatus for determining the position of a reverser control handle on a control stand of a locomotive or other railway transit vehicle, according to claim 1, in which said first signals from said sensing means are substantially identical.

3. An apparatus for determining the position of a reverser control handle on a control stand of a locomotive or other railway transit vehicle, according to claim 1, in which said sensing means are disposed substantially diametrically on either side of said axle.

4. An apparatus for determining the position of a reverser control handle on a control stand of a locomotive or other railway transit vehicle, according to claim 1, in which said sensor activators are disposed at opposite ends of a vane secured to said axle.

5. An apparatus for determining the position of a reverser control handle on a control stand of a locomotive or other railway transit vehicle, according to claim 1, in which vane is secured in a position substantially tangent to said axle.

6. An apparatus for determining the position of a reverser control handle on a control stand of a locomotive or other railway transit vehicle, according to claim 1, in which said sensing means are secured to a stationary structural element substantially perpendicular to said partially rotatable axle.

7. An apparatus for determining the position of a reverser control handle on a control stand of a locomotive or other railway transit vehicle, according to claim 1, in which said sensing means are photomicrosensors.

8. An apparatus for determining the position of a reverser control handle on a control stand of a locomotive or other railway transit vehicle, according to claim 7, in which said photomicrosensors are slotted optical switches.

9. An apparatus for determining the position of a reverser control handle on a control stand of a locomotive or other railway transit vehicle, according to claim 8 in which said slotted optical switches are of the type provided with an LED and a non-amplified phototransistor output.

10. An apparatus for determining the position of a reverser control handle on a control stand of a locomotive or other railway transit vehicle, according to claim 9, in which said sensor activators are strips of metal adapted to activate and deactivate said slotted optical switches.

11. An apparatus for determining the position of a reverser control handle on a control stand of a locomotive or other railway transit vehicle, according to claim 9, in which said strips of metal are adapted to interrupt light from an emitters associated with said slotted optical switches.

12. An apparatus for determining the position of a reverser control handle on a control stand of a locomotive or other railway transit vehicle, according to claim 11, in which said strips of metal have a curved configuration adapted to move relative to said slotted optical switches without being obstructed thereby.

13. An apparatus for determining the position of a reverser control handle on a control stand of a locomotive or other railway transit vehicle, according to claim 12, in which said strips of metal are of sufficient length and so disposed that partial rotation of said axle in either given direction, will cause a first of said strips of metal to be displaced from said slotted optical switch proximate thereto, without causing a second of said strips of metal to be displaced from said slotted optical switch proximate thereto.

14. An apparatus for determining the position of a reverser control handle on a control stand of a locomotive or other railway transit vehicle, according to claim 1, in which said sensing means transmit substantially identical first signals when said axle at said intermediate rotational position.

15. An apparatus for determining the position of a reverser control handle on a control stand of a locomotive or other railway transit vehicle, according to claim 14, in which said partial rotation of said axle in either direction will cause only one of said sensing means to transmit said second signal.

16. An apparatus for determining the position of a reverser control handle on a control stand of a locomotive or other railway transit vehicle, according to claim 1, in which said sensing means transmit substantially identical second signals when either is activated by displacement of the associated sensor activator.

* * * * *

UNITED STATES PATENT AND TRADEMARK OFFICE
CERTIFICATE OF CORRECTION

PATENT NO. : 5,519,299
DATED : May 21, 1996
INVENTOR(S) : Vincent Ferri et al.

It is certified that error appears in the above-indentified patent and that said Letters Patent is hereby corrected as shown below:

```
Column 2, line 1, after "connections", insert --with--;
column 2, line 66, delete "in either" and insert --given--.
Column 3, line 35, delete "objects" and insert --object--;
column 3, line 43, after "rely", insert --on--.
Column 4, line 16, delete "if" and insert --it--;
column 4, line 29, after "view", insert --of--;
column 4, line 31, after "handle 5", insert --, as shown in
Figure 2,--.
Column 5, line 1, after "adapted", insert --to--;
column 5, line 37, delete "According" and insert --
Accordingly--;
column 5, line 64, delete "utilizes" and insert
--utilized--.
Column 6, line 3, delete "120" and insert --20--;
column 6, line 15, delete "modification" and
insert --modifications--;
column 6, line 22, delete "utilizes" and
insert --utilized--;
column 6, line 26, delete "if" and insert --in--;
column 6, line 30, delete "sensors";
column 6, line 39, delete "achieved" and insert --achieve--.
Column 7, line 14, delete "encoding".
```

Signed and Sealed this

Twenty-fifth Day of February, 1997

Attest:

BRUCE LEHMAN

Attesting Officer

Commissioner of Patents and Trademarks